(12) United States Patent
Kawakami et al.

(10) Patent No.: US 11,814,745 B2
(45) Date of Patent: Nov. 14, 2023

(54) METHOD FOR PRODUCING SILICON SINGLE CRYSTAL

(71) Applicant: SUMCO CORPORATION, Tokyo (JP)

(72) Inventors: Yasufumi Kawakami, Nagasaki (JP); Koichi Maegawa, Nagasaki (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/622,502

(22) PCT Filed: Jun. 15, 2018

(86) PCT No.: PCT/JP2018/023030
§ 371 (c)(1),
(2) Date: Dec. 13, 2019

(87) PCT Pub. No.: WO2019/003968
PCT Pub. Date: Jan. 3, 2019

(65) Prior Publication Data
US 2021/0040642 A1   Feb. 11, 2021

(30) Foreign Application Priority Data

Jun. 29, 2017   (JP) .................................. 2017-127511

(51) Int. Cl.
*C30B 15/04* (2006.01)
*C30B 15/20* (2006.01)
*C30B 29/06* (2006.01)

(52) U.S. Cl.
CPC .............. *C30B 15/04* (2013.01); *C30B 15/20* (2013.01); *C30B 29/06* (2013.01)

(58) Field of Classification Search
CPC .......... C30B 15/04; C30B 15/20; C30B 29/06
See application file for complete search history.

(56) References Cited

U.S. PATENT DOCUMENTS

| | | | |
|---|---|---|---|
| 6,267,816 B1* | 7/2001 | Izumi | ................... C30B 15/305 |
| | | | 117/917 |
| 2002/0000188 A1* | 1/2002 | Weber | ..................... C30B 29/06 |
| | | | 117/13 |

(Continued)

FOREIGN PATENT DOCUMENTS

| | | |
|---|---|---|
| CN | 105951173 A | 9/2016 |
| DE | 112017006524 T5 | 12/2019 |

(Continued)

OTHER PUBLICATIONS

International Search Report issued in International Patent Application No. PCT/JP2018/023030, dated Aug. 21, 2018.

(Continued)

*Primary Examiner* — Hua Qi
(74) *Attorney, Agent, or Firm* — Greenblum & Bernstein, P.L.C.

(57) ABSTRACT

A production method of monocrystalline silicon includes: growing the monocrystalline silicon having a straight-body diameter in a range from 301 mm to 330 mm that is pulled up through a Czochralski process from a silicon melt including a dopant in a form of red phosphorus; controlling a resistivity of the monocrystalline silicon at a straight-body start point to fall within a range from 1.20 mΩcm to 1.35 mΩcm; and subsequently sequentially decreasing the resistivity of the monocrystalline silicon to fall within a range from 0.7 mΩcm to 1.0 mΩcm at a part of the monocrystalline silicon.

2 Claims, 5 Drawing Sheets

(56) References Cited

U.S. PATENT DOCUMENTS

| | | | | |
|---|---|---|---|---|
| 2004/0083947 A1* | 5/2004 | Weber | ............... | C30B 29/06 117/19 |
| 2004/0118333 A1* | 6/2004 | Lu | ............... | C30B 15/203 117/14 |
| 2007/0157871 A1* | 7/2007 | Inagaki | ............... | C30B 29/06 117/13 |
| 2011/0140241 A1* | 6/2011 | Kawazoe | ............... | C30B 15/14 264/145 |
| 2016/0108551 A1* | 4/2016 | Basak | ............... | C30B 15/20 117/28 |
| 2017/0327966 A1* | 11/2017 | Narushima | ............... | C30B 15/20 |

FOREIGN PATENT DOCUMENTS

| | | | |
|---|---|---|---|
| DE | 112018002156 T5 | | 1/2020 |
| DE | 112018002171 T5 | | 2/2020 |
| JP | 2009-292684 | | 12/2009 |
| JP | 2010-184839 | | 8/2010 |
| JP | 2012-206874 | | 10/2012 |
| JP | 2017-043515 A | | 3/2017 |
| JP | 2018-104206 | | 7/2018 |
| KR | 20040043974 A | * | 5/2004 |
| WO | 2010/021272 | | 2/2010 |
| WO | WO-2016103987 A1 | * | 6/2016 ............ C30B 15/04 |

OTHER PUBLICATIONS

International Preliminary Report on Patentability issued in International Patent Application No. PCT/JP2018/023030, dated Dec. 31, 2019.

Written Opinion of the International Searching Authority for International Patent Application No. PCT/JP2018/023030, dated Aug. 21, 2018.

Office Action for CN App. No. 201880043340.9, dated Jan. 8, 2021 (w/ translation).

Office Action for JP App. No. 2019-526805, dated Jan. 12, 2021 (w/ translation).

Office Action for DE App. No. 11 2018 003 320.1, dated Mar. 17, 2022 (w/ translation).

* cited by examiner

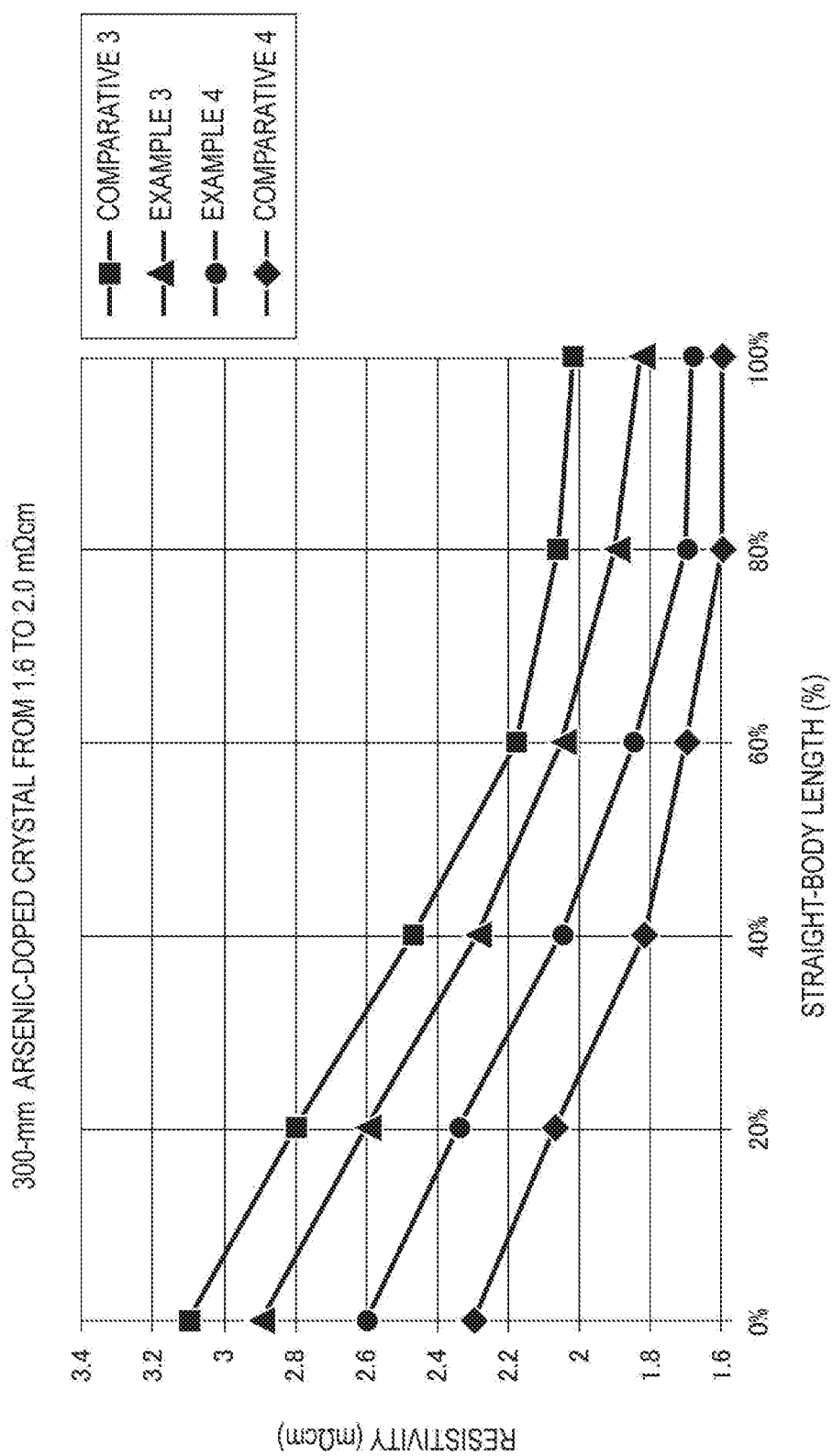

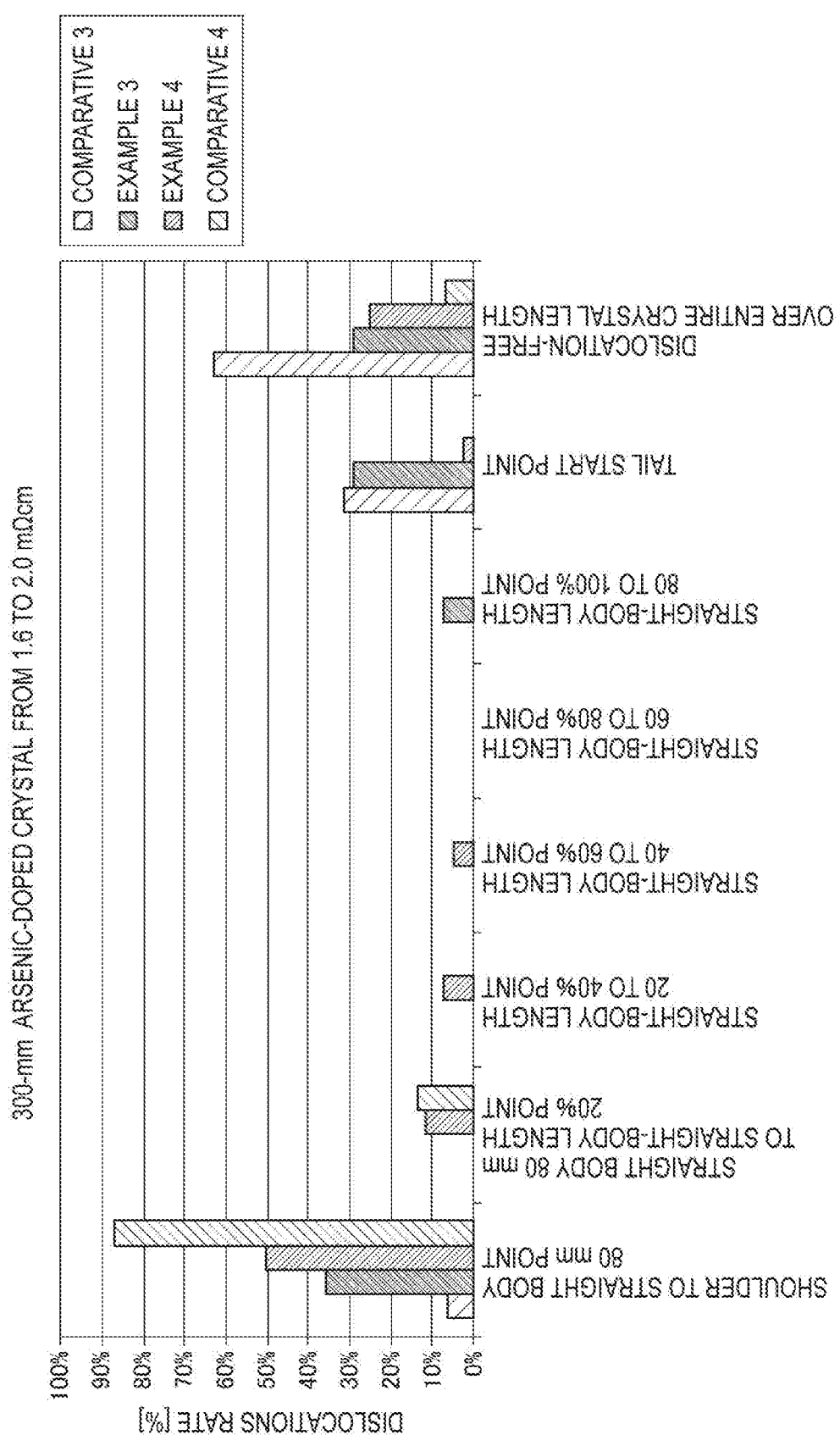

METHOD FOR PRODUCING SILICON SINGLE CRYSTAL

TECHNICAL FIELD

The present invention relates to a production method of monocrystalline silicon.

BACKGROUND ART

In recent years, mobile devices such as mobile phones have been widely used. Such devices strongly require long-term portability and usability. Accordingly, efforts have been made to increase a capacity of a battery installed in the mobile device and decrease power consumption of the mobile device itself.

In order to decrease power consumption of the mobile device itself, it is necessary to decrease power consumption of a semiconductor device installed in the mobile device.

For instance, since a low voltage power MOSFET (Metal Oxide Semi-Conductor Field Effect Transistor), which is used as an electric power device for a mobile device, has a certain internal electric resistance in an ON state, the low voltage power MOSFET itself consumes electric power in accordance with an electrical current passing through the low voltage power MOSFET.

Accordingly, if the internal electric resistance of the low voltage power MOSFET in the ON state can be reduced, power consumption of the mobile device can be lowered. Based on such a background, an N-type monocrystalline silicon having a low electric resistance is strongly demanded in order to achieve a small electric resistance of the low voltage power MOSFET in the ON state.

In a typical production method of monocrystalline silicon, monocrystalline silicon is pulled up while a resistivity thereof is controlled to meet a target value such that the resistivity of the entire monocrystalline silicon is constant.

The monocrystalline silicon having such a low resistivity has been known for easily causing dislocations during being pulled up through a Czochralski process and the like in a production process.

Patent Literature 1 discloses that, noting that a dopant concentration becomes high to generate abnormal growth due to compositional supercooling phenomenon in a tail of the monocrystalline silicon just before the end of the pulling up of the monocrystalline silicon, occurrence of dislocations in the tail is prevented by increasing the resistivity of the monocrystalline silicon at the tail.

CITATION LIST

Patent Literature(s)

Patent Literature 1: JP 2010-184839 A

SUMMARY OF THE INVENTION

Problem(s) to be Solved by the Invention

However, in typical techniques including that of Patent Literature 1, when the concentration of the dopant to be added to a silicon melt is increased in order to reduce the resistivity of the monocrystalline silicon to be pulled up, a freezing point depression of the silicon melt becomes very large to generate abnormal growth due to compositional supercooling phenomenon. Due to the abnormal growth, after the monocrystalline silicon starts to be pulled up, dislocations sometimes occur at a growth point of about 20% of a straight body from a shoulder.

In this case, a seed crystal needs to be immersed into the silicon melt in a crucible and be again pulled up. However, repetition of the pulling up increases a production cost of an ingot of the monocrystalline silicon.

An object of the invention is to provide a production method of monocrystalline silicon having a low resistivity and a straight-body diameter in a range from 301 mm to 330 mm, without increasing a production cost.

Means for Solving the Problem(s)

Focusing on occurrence of dislocations at a straight-body start point, according to the invention, a resistivity at the straight-body start point is determined to be larger than a target value and subsequently the resistivity is sequentially reduced, thereby preventing the occurrence of the dislocations at the straight-body start point.

Specifically, according to an aspect of the invention, a production method of monocrystalline silicon includes: growing the monocrystalline silicon having a straight-body diameter in a range from 301 mm to 330 mm that is pulled up through a Czochralski process from a silicon melt including a dopant in a form of red phosphorus; controlling a resistivity of the monocrystalline silicon at a straight-body start point to fall within a range from 1.20 mΩcm to 1.35 mΩcm; and subsequently sequentially decreasing the resistivity of the monocrystalline silicon to fall within a range from 0.7 mΩcm to 1.0 mΩcm at a part of the monocrystalline silicon.

According to the above aspect of the invention, occurrence of dislocations is preventable by determining the resistivity of the monocrystalline silicon at the straight-body start point to range from 1.20 mΩcm to 1.35 mΩcm. Accordingly, repetition of pulling up the monocrystalline silicon can be prevented and a production cost is not increased, so that the monocrystalline silicon having a low resistivity and doped with red phosphorus is producible.

According to another aspect of the invention, a production method of monocrystalline silicon includes: growing the monocrystalline silicon having a straight-body diameter in a range from 301 mm to 330 mm that is pulled up through a Czochralski process from a silicon melt including a dopant in a form of arsenic; controlling a resistivity of the monocrystalline silicon at a straight-body start point to fall within a range from 2.50 mΩcm to 2.90 mΩcm; and subsequently sequentially decreasing the resistivity of the monocrystalline silicon to fall within a range from 1.6 mΩcm to 2.0 mΩcm at a part of the monocrystalline silicon.

According to the above aspect of the invention, with the same actions and effects as the above, monocrystalline silicon having a low resistivity and doped with arsenic is producible without increasing the production cost.

DESCRIPTION OF EMBODIMENT(S)

FIG. 1 schematically illustrates a structure of a pull-up apparatus of monocrystalline silicon according to an exemplary embodiment of the invention.

FIG. 4 is a graph showing a relationship between a straight-body length and a resistivity in monocrystalline silicon in Examples with arsenic as the dopant.

FIG. 5 is a graph showing a relationship between a straight-body length and an occurrence rate of dislocations in monocrystalline silicon in Examples with arsenic as the dopant.

DESCRIPTION OF EMBODIMENT(S)

[1] Arrangement of Pull-Up Apparatus 1 of Monocrystalline Silicon

Figure 1:
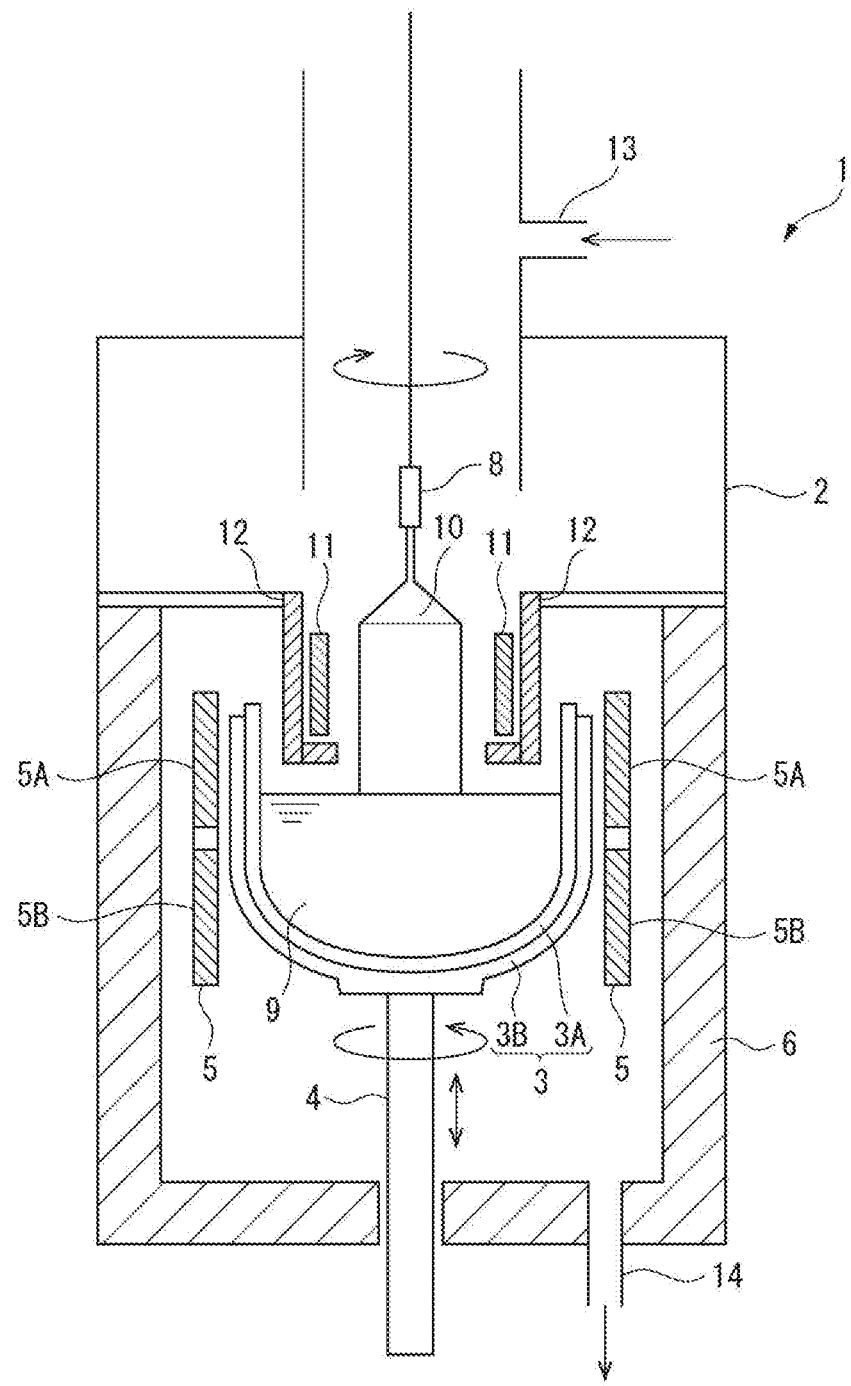

FIG. 1 schematically shows an exemplary structure of a pull-up apparatus 1 for monocrystalline silicon. A production method of monocrystalline silicon according to an exemplary embodiment of the invention is applicable to the pull-up apparatus 1. The pull-up apparatus 1 includes a chamber 2 forming an external body and a crucible 3 disposed at the center of the chamber 2.

The crucible 3, which has a double structure formed by an inner quartz crucible 3A and an outer graphite crucible 3B, is fixed to an upper end of a support shaft 4 that is rotatable and vertically movable.

An inner diameter of the inner quartz crucible 3A of the crucible 3 is preferably in a range from 1.7 to 2.0 times as large as a straight-body diameter when the straight-body diameter of the monocrystalline silicon 10 is in a range from 301 mm to 330 mm.

If the inner diameter of the crucible 3 is larger than the above range, a diameter of an opening of each of a heat shield plate 12 (described later) and the chamber 2 is increased, whereby the evaporated dopant adheres to a furnace body and foreign substances adhere to the monocrystalline silicon 10 to be likely to cause dislocations.

By determining the inner diameter of the crucible 3 in the above range, a distance between the monocrystalline silicon 10 and the quartz crucible 3A is reducible and an evaporation amount of a silicon melt is reducible, so that evaporation of a dopant (e.g., red phosphorus and arsenic) is reducible and occurrence of dislocations at a straight-body start point due to segregation phenomenon of the dopant is preventable.

A resistance heater 5 is provided to an exterior of the crucible 3 in a manner to surround the crucible 3. A heat insulation material 6 is provided outside of the heater 5 and along an inner surface of the chamber 2.

A pulling shaft 7 (e.g., wire), which is rotatable at a predetermined speed coaxially with the support shaft 4 and in a direction opposite from or the same as the direction of the support shaft 4, is provided above the crucible 3. A seed crystal 8 is attached to a lower end of the pulling shaft 7.

A water-cooled body 11, which is a cylindrical cooler surrounding the growing monocrystalline silicon 10 above a silicon melt 9 of the crucible 3, is disposed inside the chamber 2.

The water-cooled body 11 is, for instance, made of metal (e.g., copper) having an excellent thermal conductivity and is forcibly cooled by cooling water flowing inside the water-cooled body 11. The water-cooled body 11 promotes cooling the growing monocrystalline silicon 10 and controls a temperature gradient between a central portion and a peripheral portion of the monocrystalline silicon in a direction of the pulling shaft 7.

Further, the cylindrical heat shield plate 12 is disposed surrounding an outer circumferential surface and a bottom surface of the water-cooled body 11.

The heat shield 12 shields the growing monocrystalline silicon 10 from high-temperature radiation heat from the silicon melt 9 in the crucible 3, the heater 5, and a side wall of the crucible 3. Near a solid-liquid interface (crystal growth interface), the heat shield plate 12, along with the water-cooled body 11, prevents heat diffusion to the low-temperature water-cooled body 11 and controls the temperature gradient between the central portion and the peripheral portion of the monocrystalline silicon in the direction of the pulling shaft.

A gas inlet 13 for introducing inert gas (e.g. Ar gas) into the chamber 2 is provided at an upper part of the chamber 2. A gas outlet 14, through which the gas in the chamber 2 is sucked and discharged when a vacuum pump (not shown) is driven, is provided at a lower portion of the chamber 2.

The inert gas introduced from the gas inlet 13 into the chamber 2 flows down between the growing monocrystalline silicon 10 and the water-cooled body 11, flowing through a gap (liquid surface Gap) between the lower end of the heat shield 12 and the liquid surface of the silicon melt 9, subsequently, outside the heat shield 12, further outside the crucible 3, and subsequently flowing down outside the crucible 3 to be discharged from the gas outlet 14.

For the growth of the monocrystalline silicon 10 using the pull-up apparatus 1, while an inside of the chamber 2 is kept under an inert gas atmosphere and reduced pressure, a solid material (e.g., polycrystalline silicon) filled in the crucible 3 is heated by the heater 5 to be melted, thereby forming the silicon melt 9. After the silicon melt 9 is formed in the crucible 3, the pulling shaft 7 is lowered to soak the seed crystal 8 in the silicon melt 9. While the crucible 3 and the pulling shaft 7 are rotated in a predetermined direction, the pulling shaft 7 is gradually pulled up, thereby growing the monocrystalline silicon 10 overspreading the seed crystal 8.

[2] Production Method of Monocrystalline Silicon 10

The monocrystalline silicon 10 according to the exemplary embodiment is producible using the above-described pull-up apparatus 1 by suitably adding the dopant (e.g., red phosphorus and arsenic) to the silicon melt 9 at the beginning of or during the pulling up process.

When the dopant is red phosphorus, a resistivity at a straight-body start point of the monocrystalline silicon 10 is controlled to fall within a range from 1.20 mΩcm to 1.35 mΩcm and then a doping amount of red phosphorus is sequentially increased to decrease the resistivity of the monocrystalline silicon 10. Finally, the monocrystalline silicon 10 having the resistivity in a range from 0.7 mΩcm to 1.0 mΩcm is obtained.

Similarly, when the dopant is arsenic, the resistivity at the straight-body start point of the monocrystalline silicon 10 is controlled to fall within a range from 2.50 mΩcm to 2.90 mΩcm and then a doping amount of arsenic is sequentially increased to decrease the resistivity of the monocrystalline silicon 10. Finally, the monocrystalline silicon 10 having the resistivity in a range from 1.6 mΩcm to 2.0 mΩcm is obtained.

The ingot of the monocrystalline silicon 10 according to the exemplary embodiment can be pulled up under general pull-up conditions. During the pulling up process, the addition amount of the dopant is changed, a dopant concentration is increased due to segregation phenomenon in accordance with the pulling up, an introduction amount of inert gas to be introduced into the chamber 2 is changed to promote evaporation of the dopant, and an inner pressure of the chamber 2 is changed, thereby producing the monocrystalline silicon. The inner pressure of the chamber 2 is preferably in a range from 30 kPa to 40 kPa.

When pulling up the monocrystalline silicon 10, a value of a ratio between a volume of heat by an upper heater 5A and a volume of heat by a lower heater 5B in the heater 5 is preferably in a range from 1 to 4. When the value of the ratio is less than 1, in other words, the volume of heat by the lower heater 5B is less than the volume of heat by the upper heater 5A, convection from the bottom of the crucible 3 toward under the solid-liquid interface is not strengthened, so that the convection with an unstable liquid temperature occurring from the surface of the silicon melt 9 added with the dopant toward the crystal cannot be weakened. Accordingly, the temperature of the monocrystalline silicon 10 becomes unstable to fail to eliminate or minimize occurrence of dislocations.

On the other hand, when the value of the ratio in terms of the volume of heat exceeds 4, a heat load at a lower portion of the crucible 3 is increased, so that the crucible 3 may be deformed and quartz may be peeled off.

When forming a shoulder of the monocrystalline silicon 10, it is preferable to pull up the monocrystalline silicon 10 so as not to generate a re-melt growth region of a large height (e.g., 200 μm or more). Specifically, at the start of the shoulder formation, the monocrystalline silicon 10 is pulled up while the crucible 3 is rotated at the rotation speed ranging from 16 rpm to 30 rpm. Subsequently, when a diameter of the shoulder is equal to or more than a half of the diameter of the straight body of the monocrystalline silicon 10, the rotation speed of the crucible 3 is gradually lowered to fall within a range from 4 rpm to 12 rpm.

If the monocrystalline silicon 10 is pulled up at the rotation speed of the crucible 3 exceeding 30 rpm at the start of the shoulder formation, the operation of the pull-up apparatus 1 would be unstable to highly likely cause deformation of the shoulder.

When the shoulder diameter is equal to or more than a half of the straight-body diameter of the monocrystalline silicon 10, if the rotation speed of the crucible 3 is less than 4 rpm, the silicon melt 9 added with the dopant would be unstable to highly likely cause occurrence of dislocations.

When the rotation speed of the crucible 3 exceeds 12 rpm, a fluctuation in an in-plane oxygen density and the resistivity of the monocrystalline silicon 10 is increased, resulting in an unstable crystal quality.

When forming the straight body of the monocrystalline silicon 10, it is preferable to pull up the monocrystalline silicon 10 so as not generate a re-melt region of a large height (e.g., 200 μm or more). Specifically, at the start of the straight body formation, the monocrystalline silicon 10 is pulled up while the crucible 3 is rotated at the rotation speed ranging from 9 rpm to 30 rpm. Subsequently, when the straight body of the monocrystalline silicon 10 is pulled up from a start point of the straight body to reach a range from 50 mm to 200 mm, the rotation speed of the crucible 3 is changed to a range from 0.1 rpm to 7 rpm.

If the monocrystalline silicon 10 is pulled up at the rotation speed exceeding 30 rpm at the start of the straight body formation, the operation of the pull-up apparatus 1 would be unstable to highly likely cause deformation of the straight body.

If the rotation speed of the crucible 3 is less than 0.1 rpm when the straight body is in the range from 50 mm to 200 mm from the start point of the straight body, the silicon melt 9 added with the dopant would be unstable to highly likely cause occurrence of dislocations.

When the rotation speed of the crucible 3 exceeds 7 rpm, the fluctuation in the in-plane oxygen density and the resistivity of the monocrystalline silicon 10 is increased to cause an unstable crystal quality.

It is also conceivable to eliminate or minimize occurrence of dislocations by rotating the monocrystalline silicon 10 at a high speed when forming the shoulder in the same manner as in a case where monocrystalline silicon is pulled up so as to have a straight-body diameter ranging from 201 mm to 230 mm. However, in a case of the straight-body diameter ranging from 301 mm to 330 mm, since the straight-body diameter is large, crystal deformation easily occurs and the monocrystalline silicon 10 is not rotatable at a high speed.

[3] Machining of Low Resistive Silicon Wafer and Low Resistive Epitaxial Silicon Wafer When the dopant is red phosphorus, the ingot of the monocrystalline silicon 10, which has the straight-body diameter ranging from 301 mm to 330 mm and is pulled up by the pull-up apparatus 1, has the resistivity ranging from 0.7 mΩcm to 1.0 mΩcm at a part of the ingot close to a tail of the monocrystalline silicon 10.

The part close to the tail of the monocrystalline silicon 10 is cut into a silicon wafer using a wire saw and the like. The obtained silicon wafer is subjected to lapping and polishing, whereby the silicon wafer having a resistivity from 0.7 mΩcm to 1.0 mΩcm and a diameter of 300 mm is obtainable.

Further, the processed silicon wafer is subjected to annealing and an epitaxial film is formed on a surface of the silicon wafer, thereby producing an epitaxial silicon wafer having a diameter of 300 mm, which is to be delivered to a customer.

When the dopant is arsenic, the ingot of the monocrystalline silicon 10 having the resistivity ranging from 1.6 mΩcm to 2.0 mΩcm is obtained at the part dose to the tail of the monocrystalline silicon 10 having the straight-body diameter ranging from 301 mm to 330 mm.

The part close to the tail of the monocrystalline silicon 10 is cut into a silicon wafer using a wire saw and the like. The obtained silicon wafer is subjected to lapping and polishing. Subsequently, the processed silicon wafer having the diameter of 300 mm is to be delivered to a customer According to the need, the customer forms an epitaxial film and produces semiconductor devices.

EXAMPLES

[1] Dopant in Form of Red Phosphorus

The monocrystalline silicon 10 doped with red phosphorus was pulled up while a resistivity of the monocrystalline silicon 10 was controlled by adding red phosphorus as the dopant depending on a point in a straight-body length of the monocrystalline silicon 10.

The straight-body diameter of the monocrystalline silicon 10 was set in a range from 301 mm to 330 mm. The crucible 3 with the inner diameter of 22 inch (558.8 mm) (the inner diameter of the crucible 3/the straight-body diameter of the monocrystalline silicon=1.86) was used in Examples. The crucible 3 having the inner diameter of 32 inch (812.8 mm) (the inner diameter of the crucible 3/the straight-body diameter of the monocrystalline silicon=2.70) was used in Comparatives.

In Examples, the rotation speed of the crucible 3 was 16 rpm at the start of the formation of the shoulder of the monocrystalline silicon 10. When the diameter of the shoulder reached 150 mm, the rotation speed was changed to 9 rpm, which defined 9 rpm as the rotation speed of the crucible 3 at the straight-body start point. The rotation speed was changed to 6 rpm at a point of 100 mm from the straight-body start point.

On the other hand, in Comparatives, the rotation speed of the crucible 3 was 14 rpm at the start of the formation of the shoulder of the monocrystalline silicon 10. When the diameter of the shoulder reached 150 mm, the rotation speed was changed to 6 rpm. While maintaining 6 rpm, the straight body was pulled up. Results are shown in Table 1 and FIG. 2.

In the following description, a straight-body length 0% point refers to a start point of the straight-body of the monocrystalline silicon 10, and a straight-body length 100% point refers to a start point of the tail of the monocrystalline silicon 10.

TABLE 1

|  |  | Comp. 1 | Ex. 1 | Ex. 2 | Comp. 2 |
|---|---|---|---|---|---|
| resistivity [mΩcm] | straight-body length 0% point (end of shoulder) | 1.45 | 1.35 | 1.22 | 1.15 |
|  | straight-body length 20% point | 1.3 | 1.23 | 1.13 | 1.06 |
|  | straight-body length 40% point | 1.2 | 1.13 | 1.05 | 0.98 |
|  | straight-body length 60% point | 1.11 | 1.03 | 0.96 | 0.89 |
|  | straight-body length 80% point | 1.05 | 0.97 | 0.87 | 0.8 |
|  | straight-body length 100% point (tail start point) | 1.01 | 0.92 | 0.8 | 0.72 |

Presence or absence of occurrence of dislocations was checked at each point. Results are shown in Table 2 and FIG. 3. In Table 2, a crystal yield refers to a rate in length of a part of the monocrystalline silicon having the resistivity of 0.7 mΩcm or less relative to the monocrystalline silicon pulled up without occurrence of dislocations.

TABLE 2

|  |  | Comp. 1 | Ex. 1 | Ex. 2 | Comp. 2 |
|---|---|---|---|---|---|
| dislocations rate (trial no./trial no.) | shoulder to straigh-body 80 mm point | 7% | 21% | 30% | 87% |
|  | straigh-body 80 mm point to straigh-body length 20% point | 7% | 7% | 10% | 7% |
|  | straigh-body length 20% to 40% point | 0% | 0% | 0% | 0% |
|  | straigh-body length 40% to 60% point | 0% | 0% | 0% | 0% |
|  | straigh-body length 60% to 80% point | 0% | 7% | 0% | 0% |
|  | straigh-body length 80% to 100% point | 0% | 7% | 10% | 0% |
|  | tail start point | 0% | 14% | 10% | 0% |
|  | dislocation-free in entire crystal length | 87% | 43% | 40% | 7% |
|  | total | 100% | 100% | 100% | 100% |
| N number (trial no.) | shoulder to straigh-body 80 mm point | 1 | 3 | 3 | 13 |
|  | straigh-body 80 mm point to straigh-body length 20% point | 1 | 1 | 1 | 1 |
|  | straigh-body length 20% to 40% point | 0 | 0 | 0 | 0 |
|  | straigh-body length 40% to 60% point | 0 | 0 | 0 | 0 |
|  | straigh-body length 60% to 80% point | 0 | 1 | 0 | 0 |
|  | straigh-body length 80% to 100% point | 0 | 1 | 1 | 0 |
|  | tail | 0 | 2 | 1 | 0 |
|  | dislocation-free in entire crystal length | 13 | 6 | 4 | 1 |
|  | total | 15 | 14 | 10 | 15 |
|  | diameter | 300 mm | 300 mm | 300 mm | 300 mm |
|  | dopant | red phosphorus | red phosphorus | red phosphorus | red phosphorus |
|  | crystal yield | 0% | 7% | 22% | 30% |
|  | charge amount | 160 | 160 | 160 | 160 |
|  | straight-body length | 715 | 715 | 715 | 715 |
|  | rate of successful crystal in length | 0 | 10% | 30% | 40% |
|  | length of successful crystal | 0 | 71.5 | 214.5 | 286 |

Figure 2:
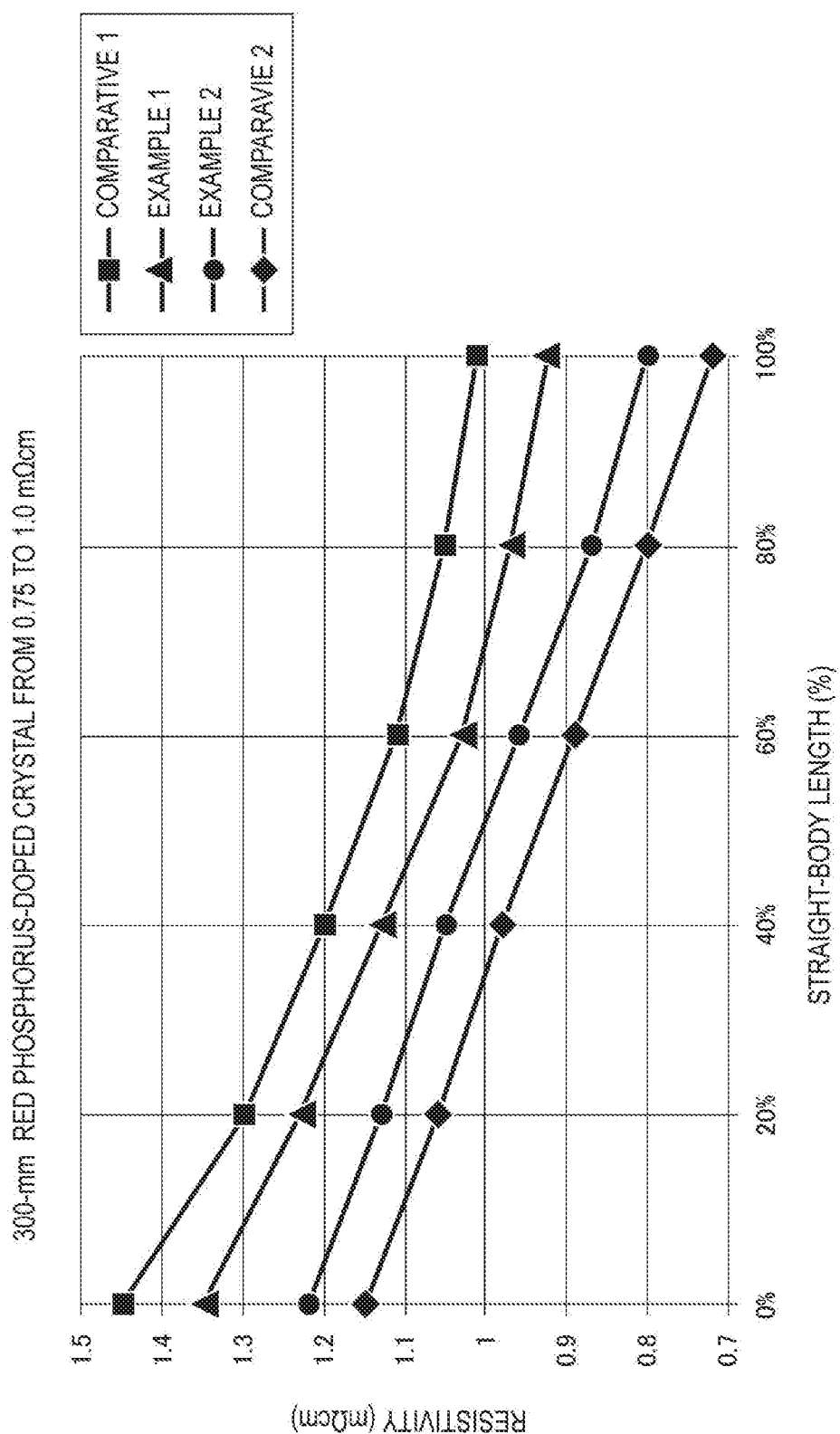
FIG. 2 is a graph showing a relationship between a straight-body length and a resistivity in monocrystalline silicon in Examples with red phosphorus as a dopant.
Figure 3:
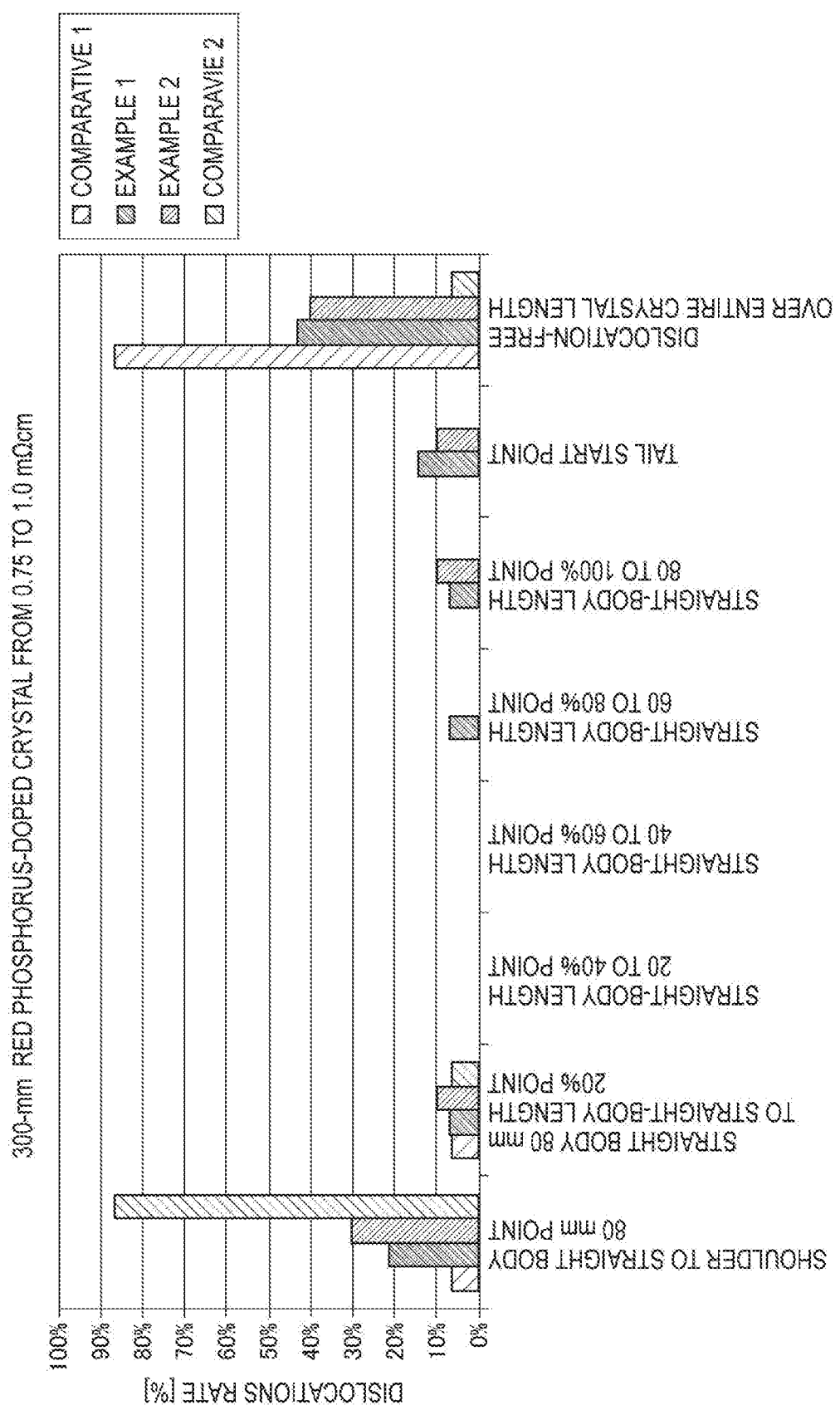
FIG. 3 is a graph showing a relationship between a straight-body length and an occurrence rate of dislocations in monocrystalline silicon in Examples with red phosphorus as the dopant.

In the monocrystalline silicon in Comparative 1 as understood from Table 2 and FIG. 3, the occurrence rate of dislocations before reaching a point of 80 mm from the straight-body start point was 7%, which means that occurrence of dislocations was preventable at a high probability. However, as understood from Table 1 and FIG. 2, the resistivity of the monocrystalline silicon was 1.0 mΩcm even at the straight-body length 100% point. Thus, the monocrystalline silicon having a low resistivity of 1.0 mΩcm or less was not produced.

The monocrystalline silicon in Comparative 2 had the resistivity of 1.0 mΩcm or less at a point indicating 35% of the straight-body length (hereinafter, referred to as the straight-body length 35% point) from the straight-body start point as understood from Table 1 and FIG. 2. However, as understood from Table 2 and FIG. 3. the occurrence rate of dislocations until reaching the point of 80 mm from the straight-body start point was as extremely high as 87%. Accordingly, when dislocations occur before reaching the point of 80 mm from the straight-body start point, a seed crystal needs to be again immersed into the melt and pulled up, resulting in increasing the production cost.

In contrast, the resistivity of the monocrystalline silicon in Example 1 was 1.0 mΩcm or less at the straight-body length 70% point from the straight-body start point. Further, the occurrence rate of dislocations before reaching 80 mm from the straight-body start point was as low as 21% and the monocrystalline silicon 10 that was dislocation-free over the entire length accounted for 43%. Thus, it was confirmed that the monocrystalline silicon having a low resistivity of 1.0 mΩcm or less was producible at a low cost.

Likewise, the resistivity of the monocrystalline silicon in Example 2 was 1.0 mΩcm or less at the straight-body length 50% point from the straight-body start point. Further, the occurrence rate of dislocations before reaching the point of 80 mm from the straight-body start point was as low as 30% and the monocrystalline silicon 10 that was dislocation-free over the entire length accounted for 40%. Thus, it was confirmed that the monocrystalline silicon having a low resistivity of 1.0 mΩcm or less was producible at a low cost.

[2] Dopant in Form of Arsenic

The monocrystalline silicon 10 doped with arsenic was pulled up while a resistivity of the monocrystalline silicon 10 was controlled by adding arsenic as the dopant depending on a point in the straight-body length of the monocrystalline silicon 10. Results are shown in Table 3 and FIG. 4. The inner diameter of the crucible 3, the straight-body diameter of the monocrystalline silicon 10, and the rotation speed of the crucible 3 were the same as those when red phosphorus was used.

TABLE 3

|  |  | Comp. 3 | Ex. 3 | Ex. 4 | Comp. 4 |
|---|---|---|---|---|---|
| resistivity [mΩcm] | straight-body length 0% point (end of shoulder) | 3.1 | 2.9 | 2.6 | 2.3 |
|  | straight-body length 20% point | 2.8 | 2.6 | 2.34 | 2.07 |
|  | straight-body length 40% point | 2.47 | 2.29 | 2.05 | 1.82 |
|  | straight-body length 60% point | 2.19 | 2.05 | 1.85 | 1.7 |
|  | straight-body length 80% point | 2.06 | 1.9 | 1.7 | 1.6 |
|  | straight-body length 100% point (tail start point) | 2.01 | 1.83 | 1.683 | 1.6 |

Presence or absence of occurrence of dislocations was checked in each point. Results are shown in Table 4 and FIG. 5.

TABLE 4

|  |  | Comp. 3 | Ex. 3 | Ex. 4 | Comp. 4 |
|---|---|---|---|---|---|
| dislocations rate (trial no./trial no.) | shoulder to straigh-body 80 mm point | 6% | 36% | 50% | 87% |
|  | straigh-body 80 mm point to straigh-body length 20% point | 0% | 0% | 11% | 13% |
|  | straigh-body length 20% to 40% point | 0% | 0% | 7% | 0% |
|  | straigh-body length 40% to 60% point. | 0% | 0% | 5% | 0% |
|  | straigh-body length 60% to 80% point | 0% | 0% | 0% | 0% |
|  | straigh-body length 80% to 100% point | 0% | 7% | 0% | 0% |
|  | tail start point | 31% | 29% | 2% | 0% |
|  | dislocation-free in entire crystal length | 63% | 29% | 25% | 7% |
|  | total | 100% | 100% | 100% | 107% |
| N number (trial no.) | shoulder to straigh-body 80 mm point | 1 | 5 | 22 | 13 |
|  | straigh-body 80 mm point to straigh-body length 20% point | 0 | 0 | 5 | 2 |
|  | straigh-body length 20% to 40% point | 0 | 0 | 3 | 0 |
|  | straigh-body length 40% to 60% point | 0 | 0 | 2 | 0 |
|  | straigh-body length 60% to 80% point | 0 | 0 | 0 | 0 |
|  | straigh-body length 80% to 100% point | 0 | 1 | 0 | 0 |
|  | tail | 5 | 4 | 1 | 0 |
|  | dislocation-free in entire crystal length | 10 | 4 | 11 | 1 |
|  | total | 16 | 14 | 44 | 15 |
|  | diameter | 300 mm | 300 mm | 300 mm | 300 mm |
|  | dopant | arsenic | arsenic | arsenic | arsenic |
|  | crystal yield | 0% | 22% | 44% | 52% |

TABLE 4-continued

|  | Comp. 3 | Ex. 3 | Ex. 4 | Comp. 4 |
| --- | --- | --- | --- | --- |
| charge amount | 160 | 160 | 160 | 160 |
| straight-body length | 710 | 710 | 710 | 710 |
| rate of successful crystal in length | 0% | 30% | 60% | 70% |
| length of successful crystal | 0 | 213 | 426 | 497 |

In the monocrystalline silicon in Comparative 3 as understood from Table 4 and FIG. 5, the occurrence rate of dislocations before reaching a point of 80 mm from the straight-body start point was 6%, which means that occurrence of dislocations was preventable at a high probability. However, as understood from Table 3 and FIG. 4, the resistivity was 2.0 mΩcm even at the straight-body length 100% point. Thus, the monocrystalline silicon having a low resistivity of 2.0 mΩcm or less was not produced.

The monocrystalline silicon in Comparative 4 had the resistivity of 2.0 mΩcm or less at the straight-body length 25% point from the straight-body start point as understood from Table 3 and FIG. 4. However, as understood from Table 4 and FIG. 5. the occurrence rate of dislocations until reaching the point of 80 mm from the straight-body start point was as extremely high as 87%. Accordingly, when dislocations occur before reaching the point of 80 mm from the straight-body start point, a seed crystal needs to be again immersed into the melt and pulled up, resulting in increasing the production cost.

In contrast, the resistivity of the monocrystalline silicon in Example 3 was 2.0 mΩcm or less at the straight-body length 65% point from the straight-body start point. Further, the occurrence rate of dislocations before reaching the point of 80 mm from the straight-body start point was as low as 36% and the monocrystalline silicon 10 that was dislocation-free over the entire length accounted for 29%. Thus, it was confirmed that the monocrystalline silicon having a low resistivity of 2.0 mΩcm or less was producible at a low cost.

Likewise, the resistivity of the monocrystalline silicon in Example 4 was able to be made 2.0 mΩcm or less at the straight-body length 45% point from the straight-body start point. Further, the occurrence rate of dislocations before reaching the point of 80 mm from the straight-body start point was as low as 50% and the monocrystalline silicon 10 that was dislocation-free over the entire length accounted for 25%. Thus, it was confirmed that the monocrystalline silicon having a low resistivity of 2.0 mΩcm or less was producible at a low cost.

From the foregoing, when the monocrystalline silicon was pulled up through the Czochralski process from the silicon melt containing red phosphorus as the dopant, the resistivity of the monocrystalline silicon at the straight-body start point was controlled to fall within a range from 1.20 mΩcm to 1.35 mΩcm and was subsequently sequentially decreased, so that the resistivity of a part of the monocrystalline silicon fell within a range from 0.7 mΩcm to 1.0 mΩcm and occurrence of dislocations of the monocrystalline silicon was prevented.

Likewise, when the monocrystalline silicon was pulled up through Czochralski process from the silicon melt containing arsenic as the dopant, the resistivity of the monocrystalline silicon at the straight-body start point was controlled to fall within a range from 2.50 mΩcm to 2.90 mΩcm and was subsequently sequentially decreased, so that the resistivity of a part of the monocrystalline silicon became in a range from 1.6 mΩcm to 2.0 mΩcm and occurrence of dislocations of the monocrystalline silicon was prevented.

The invention claimed is:

1. A production method of a monocrystalline silicon, comprising:
   growing the monocrystalline silicon having a straight-body diameter in a range from 301 mm to 330 mm that is pulled up through a Czochralski process from a silicon melt comprising a dopant in a form of red phosphorus, an inner diameter of a quartz crucible that stores the silicon melt being 1.7 to 2.0 times as large as the straight-body diameter;
   pulling up the monocrystalline silicon while rotating the quartz crucible at a rotation speed ranging from 9 rpm to 30 rpm at a start of formation of the straight-body;
   changing the rotation speed of the quartz crucible to a range from 0.1 rpm to 7 rpm in a case that the straight-body of the monocrystalline silicon is pulled up from a straight-body start point of the monocrystalline silicon to reach a range from 50 mm to 200 mm;
   controlling a resistivity of the monocrystalline silicon at the straight-body start point to fall within a range from 1.20 mΩcm to 1.35 mΩcm; and
   subsequently sequentially decreasing the resistivity of the monocrystalline silicon to fall within a range from 0.7 mΩcm to 1.0 mΩcm at a part of the monocrystalline silicon.

2. The method of claim 1, further comprising:
   pulling up the monocrystalline silicon while rotating the quartz crucible at a rotation speed ranging from 16 rpm to 30 rpm at a start of formation of a shoulder, and lowering the rotation speed of the quartz crucible to fall within a range from 4 rpm to 12 rpm in a case that a diameter of the shoulder is equal to or more than a half of the straight-body diameter.

* * * * *